United States Patent
Chudzik et al.

(10) Patent No.: US 8,901,706 B2
(45) Date of Patent: Dec. 2, 2014

(54) THERMALLY STABLE HIGH-K TETRAGONAL HFO₂ LAYER WITHIN HIGH ASPECT RATIO DEEP TRENCHES

(75) Inventors: Michael P. Chudzik, Danbury, CT (US); Bachir Dirahoui, Bedford Hills, NY (US); Rishikesh Krishnan, Poughkeepsie, NY (US); Siddarth A. Krishnan, Peekskill, NY (US); Oh-jung Kwon, Hopewell Junction, NY (US); Paul C. Parries, Wappingers Falls, NY (US); Hongwen Yan, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 427 days.

(21) Appl. No.: 13/345,290

(22) Filed: Jan. 6, 2012

(65) Prior Publication Data
US 2013/0175665 A1    Jul. 11, 2013

(51) Int. Cl.
*H01L 21/02*    (2006.01)
(52) U.S. Cl.
USPC ............ 257/532; 257/E21.008; 257/E29.343; 257/E21.24; 257/E29.022; 438/386; 438/785
(58) Field of Classification Search
CPC ..................... H01L 21/02181; H01L 21/0228; H01L 21/02321; H01L 27/1203; H01L 27/1087
USPC .................. 257/532, 622, E21.008, E29.343, 257/E21.24, E29.022; 438/386, 622
See application file for complete search history.

(56) References Cited

U.S. PATENT DOCUMENTS

| | | | |
|---|---|---|---|
| 6,969,539 B2 | 11/2005 | Gordon et al. | |
| 7,005,392 B2 | 2/2006 | Baum et al. | |
| 7,659,158 B2 | 2/2010 | Ma et al. | |
| 2006/0062917 A1 | 3/2006 | Muthukrishnan et al. | |
| 2011/0065287 A1 | 3/2011 | Wajda | |

FOREIGN PATENT DOCUMENTS

WO    2007030673 A2    3/2007

OTHER PUBLICATIONS

Cho, M., et al., "Thermal stability and structural characteristics of HfO2 films on Si (100) grown by atomic-layer deposition," Applied Physics Letters, Jul. 2002, vol. 81, No. 3, pp. 472-474.
Do, S., et al., "Physical and electrical characteristics of HfO2/Hf films deposited on silicon by atomic layer deposition," 7th IEEE Conference on Nanotechnology, IEEE-Nano 2007, Aug. 2007, pp. 357-360.
Böscke, T. S., et al., "Stabilization of higher-_tetragonal HfO2 by SiO2 admixture enabling thermally stable metal-insulator-metal capacitors," Appl. Phys. Lett., 2007, vol. 91, 072902, 3 pages.
Jin, H., et al., "Electronic properties of ultrathin (HfO2)x(SiO2)1—xdielectrics on Si (100)," J. Appl. Phys., Feb. 2007, vol. 102, 053709, 6 pages.

*Primary Examiner* — Elias M Ullah
(74) *Attorney, Agent, or Firm* — Scully, Scott, Murphy & Presser, P.C.; Joseph P. Abate, Esq.

(57) ABSTRACT

A trench structure that in one embodiment includes a trench present in a substrate, and a dielectric layer that is continuously present on the sidewalls and base of the trench. The dielectric layer has a dielectric constant that is greater than 30. The dielectric layer is composed of tetragonal phase hafnium oxide with silicon present in the grain boundaries of the tetragonal phase hafnium oxide in an amount ranging from 3 wt. % to 20 wt. %.

14 Claims, 6 Drawing Sheets

THERMALLY STABLE HIGH-K TETRAGONAL HFO₂ LAYER WITHIN HIGH ASPECT RATIO DEEP TRENCHES

BACKGROUND

The present disclosure generally relates to high-k dielectric materials, and forming high-k dielectric materials within high aspect ratio trenches.

Embedded dynamic random access memory (eDRAM) devices may include trench capacitors. A trench capacitor is a three dimensional device that can be formed by etching a trench into a semiconductor substrate. After trench etching, a buried plate electrode, also referred to as a diffusion plate, is typically formed about the exterior portion of the trench and a node dielectric is then formed on the inner walls of the trench. Next, the trench can be filled, for example, with doped polysilicon, such as N-type polycrystalline silicon ("N-type Poly-Si"). The doped poly-Si serves as one electrode of the capacitor, often referred to as the upper electrode or storage node, and the buried plate electrode serves as a second electrode of the capacitor, often referred to as the lower electrode. The node dielectric separates the buried plate and the upper electrode, and serves as the dielectric layer of the trench capacitor.

SUMMARY

A method for forming a trench structure is provided that includes a dielectric layer composed of a tetragonal phase hafnium oxide present on at least one of the sidewalls and base of the trench. In one embodiment, a method of forming a trench structure is provided that includes forming a trench in a substrate, wherein the trench has an aspect ratio greater than 20:1. A dielectric layer is deposited by atomic layer deposition (ALD) on at least one of a base and sidewalls of the trench from gas precursors including tris dimethyl amido silane, an oxygen containing precursor and a hafnium containing precursor. The dielectric layer may then be annealed to provide a tetragonal phase hafnium oxide, wherein silicon is present at the grain boundaries of the tetragonal phase hafnium oxide in an amount ranging from 3 wt. % to 20 wt. %. The dielectric layer of the tetragonal phase hafnium oxide has a dielectric constant that is greater than 30.

In another aspect of the present disclosure, a method of forming a trench structure is provided, wherein a dielectric layer of tetragonal phase hafnium oxide having a dielectric constant that is greater than 30 is present on at least one of the sidewalls and base of the trench. In one embodiment, the trench structure includes a trench having a width ranging from 30 nm to 120 nm and an aspect ratio greater than 20:1. The dielectric layer is continuously present on at least one of the sidewalls and the base of the trench. The dielectric layer has a dielectric constant that is greater than 30, and is comprised of tetragonal phase hafnium oxide with silicon present at the grain boundaries of the tetragonal phase hafnium oxide. The silicon is present at the grain boundaries in an amount ranging from 3 wt. % to 20 wt. %.

In another aspect of the present disclosure, a method of forming a memory device, such as an embedded dynamic random access memory (eDRAM) device is provided, in which a capacitor is formed including a dielectric layer composed of a tetragonal phase hafnium oxide. In one embodiment, the method of forming the memory device includes forming a trench in a semiconductor substrate, wherein the trench has an aspect ratio that is greater than 20:1. A first electrode may then be formed within the trench. The first electrode may be provided by a doped portion of the semiconductor substrate that provides the base and sidewalls of the trench, or the first electrode may be provided by a material layer that is deposited within the trench. A dielectric layer having a dielectric constant greater than 30 may be deposited by atomic layer deposition (ALD) on the first electrode from gas precursors including tris dimethyl amido silane, an oxygen containing precursor and a hafnium containing precursor. The dielectric layer provides a tetragonal phase hafnium oxide, wherein silicon is present at grain boundaries in the tetragonal phase hafnium oxide in an amount ranging from 3 wt % to 20 wt %. A second electrode is formed electrode on the dielectric layer. The second electrode, the dielectric layer, and the first electrode provide a capacitor that is present in the trench. An access transistor may be formed in electrical communication with the capacitor.

In another aspect of the present disclosure, a memory device, such as an eDRAM, is provided, in which the dielectric layer of the capacitor of the memory device is composed of tetragonal phase hafnium oxide, wherein silicon is present at the grain boundaries of the tetragonal phase hafnium oxide in an amount ranging from 3 wt. % to 20 wt. %. In one embodiment, the memory device includes a trench present in a semiconductor substrate, and a capacitor that is present in the trench. The capacitor includes a first electrode that is present about at least one of the sidewalls and base of the trench, a dielectric layer present on the first electrode, and a second electrode that is present on the dielectric layer. The dielectric layer is comprised of tetragonal phase hafnium oxide, wherein silicon is present at the grain boundaries of the tetragonal phase hafnium oxide in an amount ranging from 3 wt. % to 20 wt. %. The memory device may also include an access transistor that is in electrical communication with the capacitor.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
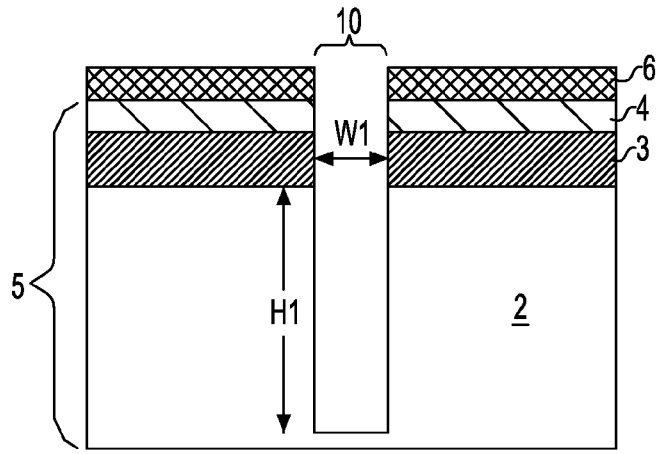
FIG. 1 is a side cross-sectional view depicting forming a trench in a semiconductor substrate, in accordance with one embodiment of the present disclosure.

Detailed embodiments of the present disclosure are disclosed herein; however, it is to be understood that the disclosed embodiments are merely illustrative and may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to methods for producing a high-k dielectric layer within a high aspect ratio trench, such as those used in embedded dynamic random aspect memory (eDRAM) devices. In embedded dynamic random access memory (eDRAM) devices, a capacitor is typically present in a trench. The capacitor of the eDRAM device typically includes a buried plate electrode, i.e., bottom electrode, node dielectric and a top electrode. A trench with a high aspect ratio is a trench having an aspect ratio that is greater than 20:1.

The present disclosure in some embodiments provides methods and structures for producing tetragonal phase hafnium oxide ($HFO_2$) having a dielectric constant that is greater than 30 in a high aspect ratio trench. Dielectric constants as described herein are at room temperature, e.g., 20° C. to 25° C., and at atmospheric pressure, e.g., 1 atm. The term "tetragonal" denotes a crystal structure that is characterized by a rectangular lattice with a square base. In some embodiments, in which the trench that the tetragonal phase hafnium oxide film is being deposited in is a component of an eDRAM memory device, the tetragonal phase hafnium oxide film may provide the node dielectric layer of a trench capacitor. The "node dielectric layer" is the dielectric layer that is present between the electrodes of the capacitor. The term "electrode" as used to describe a component of the capacitor represents one of at least two electrically conductive materials of the capacitor that are separated by a dielectric layer, e.g., node dielectric layer.

The tetragonal phase hafnium oxide ($HfO_2$) employed within the structures and methods disclosed herein are thermally stable and withstand front end of the line (FEOL) processes that are employed in the formation of semiconductor devices, such as eDRAM memory devices and transistors (e.g., access transistors to the eDRAM memory), without reducing the dielectric constant of the tetragonal phase hafnium oxide. For example, the tetragonal phase hafnium oxide formed in accordance with the present disclosure maintains a dielectric constant that is greater than 30 after being subjected to thermal annealing for processing shallow trench isolation (STI) regions, such as annealing to temperatures as great as 1000° C. to 1300° C. This is one example of a "stabilized" hafnium oxide having the tetragonal phase. "Stabilized" means that the high dielectric constant tetragonal phase is not "metastable" and does not undergo further crystallographic transformation with anneal temperatures that are as high as 1300° C.

In some embodiments, successful realization of thermally stable tetragonal phase hafnium oxide being deposited within a high aspect ratio trench, and having a dielectric constant of 30 or greater, is provided by atomic layer deposition (ALD) with precursor gasses including tris dimethyl amido silane $(((CH_3)_2N)_3SiH)$ to introduce silicon (Si) to the hafnium oxide layer being deposited. More specifically, in one embodiment, hafnium oxide is deposited by atomic layer deposition on at least one of a base and sidewalls of the trench from gas precursors including tris dimethyl amido silane, an oxygen containing precursor and a hafnium containing precursor. In one embodiment, the concentration of silicon is introduced to the hafnium oxide layer being deposited at an optimum value to produce the high-k phase, e.g., tetragonal phase. Thermal annealing at temperatures on the order of 550° C. to 800° C. stabilize the tetragonal phase of the hafnium oxide layer. For example, following annealing, the silicon introduced by the tris dimethyl amido silane is present at the grain boundaries of the tetragonal phase hafnium oxide in an amount ranging from 3 wt. % to 20 wt. %. In some embodiments, the silicon that is present at the grain boundaries of the tetragonal phase hafnium oxide is silicon dioxide ($SiO_2$). The silicon that is present at the grain boundaries of the tetragonal phase hafnium oxide reduces the mean free energy of the tetragonal phase hafnium oxide to stabilize the tetragonal phase to temperatures as great as 1300° C.

FIGS. 1-7 describe one embodiment of a method of forming a memory device, such as an embedded dynamic random access memory (eDRAM) device, in which a capacitor is formed including a dielectric layer composed of tetragonal phase hafnium oxide. The present disclosure is not only limited to eDRAM devices, as any trench structure including tetragonal phase hafnium oxide with silicon present at the grain boundaries of the tetragonal phase hafnium oxide in an amount ranging from 3 wt. % to 20 wt. % is within the scope of the present disclosure.

FIG. 1 depicts one embodiment of forming a trench 10 in a semiconductor substrate 5. In the example depicted in FIG. 1, a single trench 10 is shown for illustrative purposes and the semiconductor substrate 5 is a semiconductor on insulator (SOI) substrate that includes a semiconductor on insulator (SOI) layer 4, such as a silicon containing semiconductor layer, located on a surface of a buried dielectric layer 3, such as a buried oxide layer. Underlying the buried dielectric layer 3 is a lower semiconductor layer, i.e., base semiconductor layer 2. In one embodiment, the SOI layer 4 and the base semiconductor layer 2 are both comprised of silicon (Si). In other embodiments, the SOI layer 4 and/or the base semiconductor layer 2 may include any semiconductor material including, but not limited to, Ge, SiGe, GaAs, InAs, InP, or other III/IV compounds. The SOI layer 4 typically has a thickness greater than 5 nm, e.g., 5 nm to 200 nm. The thickness of the base semiconductor layer 2 may range up to 800 micrometers. In one embodiment, the buried dielectric layer 3 is composed of silicon oxide ($SiO_2$). In other embodiments, the buried dielectric layer 3 may be any dielectric material, such as an oxide, nitride or oxynitride. The thickness of the buried dielectric layer 3 may range from 10 nm to 500 nm. The SOI substrate may be formed using a bonding process, or it may be formed using an ion implantation process. The present disclosure is not limited to only SOI substrates, as any semiconductor substrate is suitable for use with the present disclosure including bulk semiconductor substrates.

Referring to FIG. 1, and in some embodiments, forming the trench 10 within the semiconductor substrate 5 may begin with forming an etch mask 6 on the upper surface of the semiconductor substrate 5. The etch mask 6 may be composed of one or more material layers. In one example, the etch mask 6 may be a hardmask composed of silicon oxide and/or silicon nitride. In another example, the etch mask 6 may be provided by a patterned photoresist (also referred to as photolithographic mask). For example, the photolithographic mask is produced by applying a photoresist layer on the surface of semiconductor substrate to be etched utilizing a deposition process, and patterning the photoresist layer utilizing lithography, so as to expose selective regions of the semiconductor substrate 5 in which trenches 10 are to be formed. The pattern provided by the etch mask 6 is then transferred into the semiconductor substrate 5 using an etching process. The trench 10 may be formed using an anisotropic etch process. As used herein, the term "anisotropic etch process" denotes a material removal process in which the etch rate in the direction normal to the surface to be etched is higher than in the direction parallel to the surface to be etched. Dry anisotropic etching processes suitable for forming the trench 10 include, but are not limited to, reactive ion etch, ion-beam etching, plasma etching or a combination thereof. Reactive ion etching (RIE) is a form of plasma etching in which during etching the surface to be etched is exposed to reactive gases in the presence of an RF field. The width $W_1$ of the trench 10 may range from 30 nm to 250 nm. More typically, the width $W_1$ of the trench 10 may range from 50 nm to 200 nm. In one embodiment, the final depth $H_1$ of the trench 10, as measured from the top surface of the base semiconductor layer 2 is as great as 10 μm. In one example, the final depth $H_1$ is on the order of about 3 μm to 4 microns. The aspect ratio (height to width ratio) of the trench 10 may range from 25:1 to 100:1. In one example, the aspect ratio of the trench 10 is 30:1. Following the formation of the trench 13, the etch mask 6 may be removed.

Figure 2:
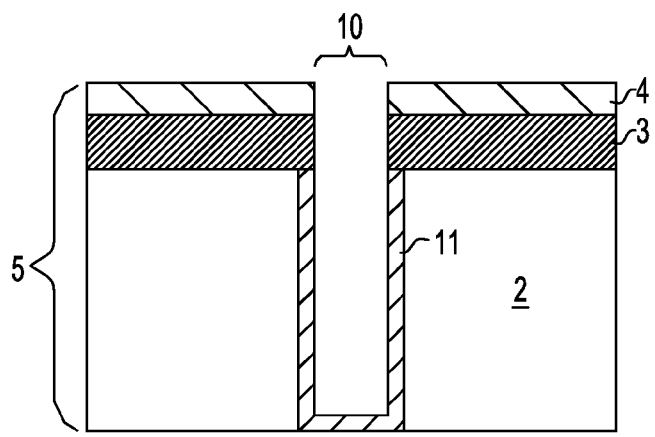
FIG. 2 is a side cross-sectional view depicting forming a first electrode within the trench, in accordance with one embodiment of the present disclosure.

FIG. 2 depicts one embodiment of forming a first electrode 11 within the trench 10. The first electrode 11 may be present about the sidewalls and base of the trench 10. By "about" it is meant that the first electrode 11 may be formed within the sidewalls and base of the trench 10, as depicted in FIG. 2, and/or the first electrode 11 may be deposited on the sidewalls and base of the trench 10. In one embodiment, in which the first electrode 11 is formed within the sidewalls and base of the trench 10, the base semiconductor layer 2 of the trench 10 may be doped with an n-type or p-type dopant. The dopant may be introduced to the base semiconductor layer 2 prior to the formation of the trench 10 by in-situ doping of the semiconductor substrate 5 during its formation. The dopant may also be introduced to the sidewalls and the base of the trench 10 by ion implantation or gas phase doping after the formation of the trench 10. In yet another embodiment, the dopant that provides the first electrode 11 may be introduced to the sidewalls of the trench 10 by depositing an arsenic doped glass on the sidewalls and base of the trench 10 followed by thermally annealing to drive the arsenic dopant from the arsenic doped glass into the sidewalls and the base of the trench 10. The concentration of the n-type or p-type dopant that is present in the base and sidewalls of the trench and provides the first electrode may range from $1 \times 10^{14}$ atoms/$cm^3$ to $1 \times 10^{19}$ atoms/$cm^3$. In one example, the dopant source to produce a N+ buried plate diffusion region may be introduced by ion-implantation. In another embodiment, the first electrode 11 may be deposited on the sidewalls and base of the trench 10. In these embodiments, the first electrode 11 may be composed of a metal, such as copper (Cu), aluminum (Al), tungsten (W), titanium (Ti), platinum (Pt) and alloys thereof. The first electrode 11 that is deposited on the sidewalls and base of the trench 10 may also be composed of a metal nitride, such as titanium nitride (TiN) and/or platinum nitride (PtN). When the first electrode 11 is deposited within the trench 10, the deposition process may be chemical vapor deposition (CVD) and/or physical vapor deposition (PVD).

Figure 3:
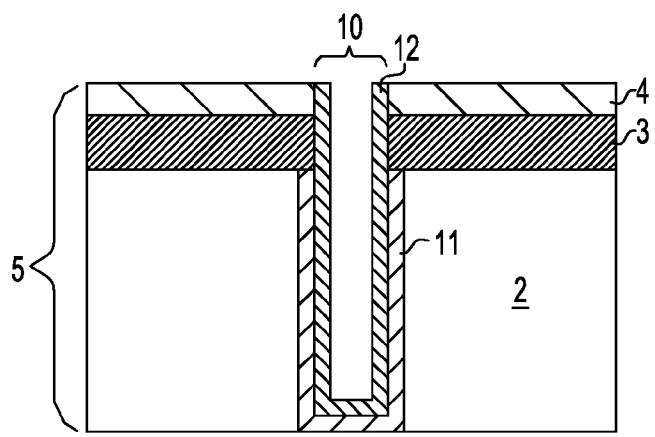
FIG. 3 is a side cross-sectional view depicting depositing a dielectric layer comprising a tetragonal phase hafnium oxide and having a dielectric constant greater than 30 by atomic layer deposition (ALD) on the first electrode, in accordance with one embodiment of the present disclosure.

FIG. 3 depicts one embodiment of depositing a dielectric layer 12 having a dielectric constant greater than 30 by atomic layer deposition (ALD) on the first electrode 11 from gas precursors including tris dimethyl amido silane, an oxygen precursor and a hafnium containing precursor. Atomic layer deposition uses sequential self-limiting surface reactions to deposit material layers in the monolayer thickness regime. Atomic layer deposition is similar in chemistry to chemical vapor deposition (CVD), except that the atomic layer deposition reaction breaks the chemical vapor deposition reaction into two half-reactions, keeping the precursor materials separate during the reaction. Due to the characteristics of self-limiting and surface reactions, atomic layer deposition film growth makes atomic scale deposition control possible. By keeping the precursors separate throughout the coating process, atomic layer control of film growth can be obtained as fine as ~0.1 Å per cycle. Separation of the precursors is accomplished by pulsing a purge gas (typically nitrogen or argon) after each gas precursor pulse to remove excess precursor from the deposition chamber of the atomic layer deposition apparatus. In one embodiment, the growth of material layers by atomic layer deposition consists of repeating the following four steps of: 1) exposure of the first precursor, 2) purge or evacuation of the deposition chamber to remove the non-reacted precursors and the gaseous reaction by-products, 3) exposure of the second precursor—or another treatment to activate the surface again for the reaction of the first precursor, and 4) purge or evacuation of the reaction chamber. To grow a material layer, reaction cycles are repeated as many as required for the desired film thickness. One cycle of atomic layer deposition may take time from 0.5 seconds to a few seconds and may deposit between 0.1 Å and 3 Å of film thickness.

In one embodiment, the hafnium containing precursor is selected from the group consisting of $(Et_2N)_4Hf$ (TDEAH), $(Me_2)_4Hf$ (TDMAH), $(EtMeN)_4Hf$ (TEMAH), $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HIMe_2$, $(acac)_4Hf$, $(hfac)_4Hf$, $(tfac)_4Hf$, $(thd)_4Hf$, $(NO_3)_4Hf$, $(^tBuO)_4Hf$, $(^iPrO)_4Hf$, $(EtO)_4Hf$, $(MeO)_4Hf$ and combinations thereof. In one embodiment, the oxygen containing precursor is selected from the group consisting of oxygen ($O_2$), ozone ($O_3$), atomic oxygen (O) and a combination thereof.

In some embodiments, the tris dimethyl amido silane gas precursor provides the silicon source to the hafnium oxide layer being formed from the hafnium containing gas precursor and the oxygen containing precursor. In one embodiment, tris dimethyl amido silane is an organosilane gas precursor having the following chemical structure:

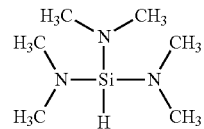

The amount of tris dimethyl amido silane gas precursor is selected so that following atomic layer deposition of the hafnium oxide layer from gas precursors of the tris dimethyl amido silane precursor, the oxygen precursor and the hafnium containing precursor, and after a heat treatment, the silicon deposited by the atomic layer deposition process will diffuse to the grain boundaries of the hafnium oxide layer to stabilize the tetragonal phase. The silicon that is present at the grain boundaries of the tetragonal hafnium oxide layer is typically silicon oxide. In one embodiment, the silicon, e.g., silicon oxide, is present at grain boundaries in the tetragonal phase hafnium oxide in an amount ranging from 3 wt. % to 20 wt. %. One embodiment of a heat treatment that is sufficient to diffuse silicon to the grain boundaries of the tetragonal hafnium oxide layer includes at thermal anneal at a temperature greater than 500° C., e.g., at least 550° C. or greater.

Referring to FIG. 3, the dielectric layer 12 of hafnium oxide deposited by atomic layer deposition may be a conformal layer that is continuously present on the sidewalls and base of the trench 10. As used herein, a "conformal layer" is a deposited material having a thickness that remains the same regardless of the geometry of underlying features on which the layer is deposited, wherein the thickness of the layer does not deviate from greater than or less than 20% of an average value for the thickness of the layer. By "continuous" it is meant that the deposited dielectric layer 12 is formed on the entirety of the trench sidewalls and base of the trench without any break in the conformity or degree of coverage by the deposited dielectric layer 12 on the sidewalls and base of the trench. The definition of "continuous" as used in the present disclosure allows for the upper portion of the deposited dielectric layer 12 of the hafnium oxide to be recessed within the trench during later processing. In this example, the remaining portion of the dielectric layer 12 (i.e., remaining portion of the dielectric layer 12 following the recess process steps) is continuous from the uppermost surface of the dielectric layer 12 that is present on the sidewalls of the trench 10 to the base of the trench 10, as well as being continuous across the base of trench 10 without any break in the conformity or degree of coverage by the deposited dielectric layer 12.

Figure 4:
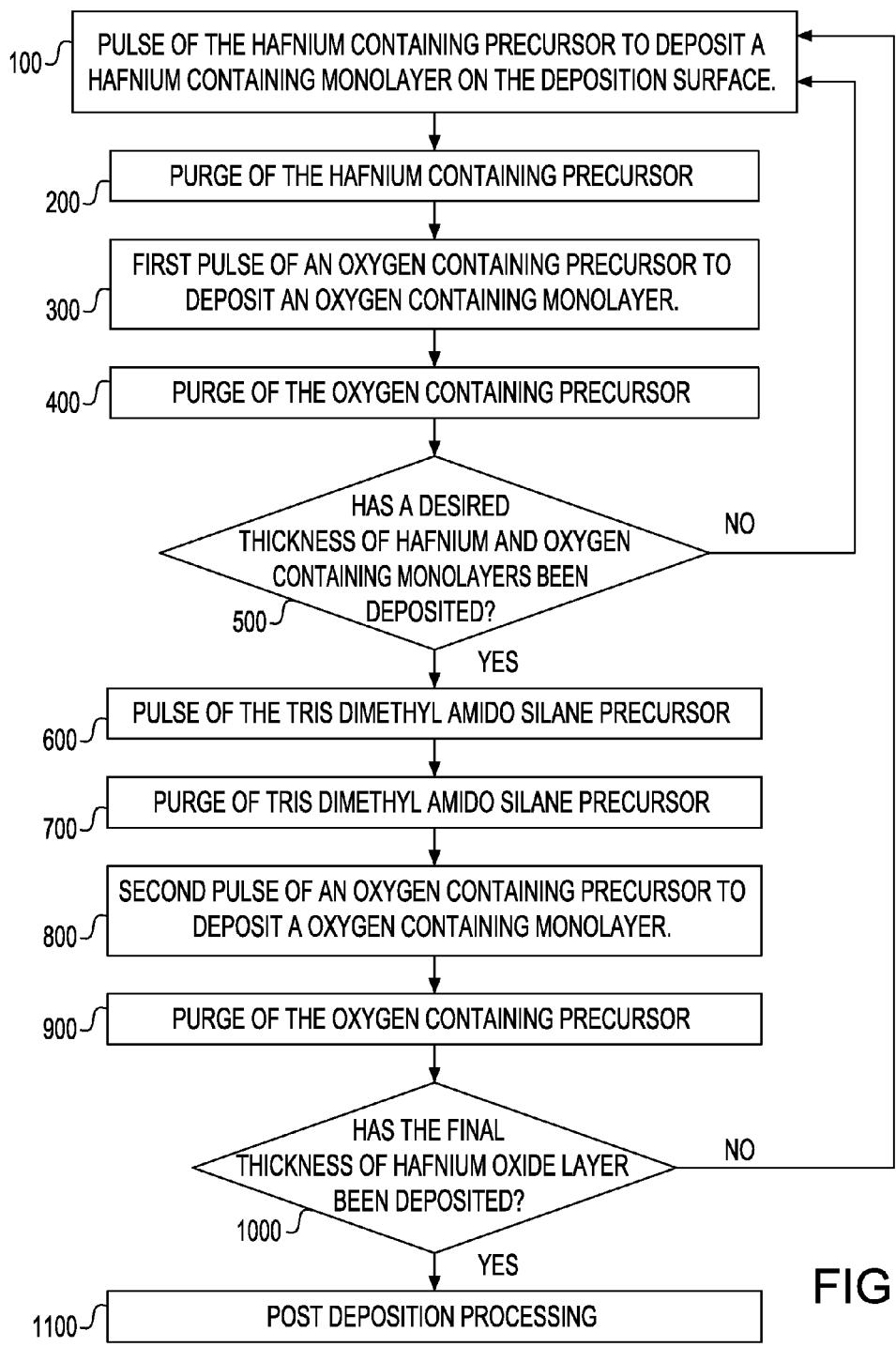
FIG. 4 is a flow chart depicting the process flow of one example of an atomic layer deposition process for depositing tetragonal phase hafnium oxide, wherein silicon is present at the grain boundaries of the tetragonal phase hafnium oxide in an amount ranging from 3 wt. % to 20 wt. %, in accordance with one embodiment of the present disclosure.

FIG. 4 depicts one example of an atomic layer deposition (ALD) sequence for forming a dielectric layer 12 that provides a tetragonal phase hafnium oxide material with silicon present at the grain boundaries of the tetragonal phase hafnium oxide. Following positioning of the semiconductor substrate 5 within the deposition chamber of an atomic layer deposition apparatus, an initial step 100 may include applying a pulse of hafnium containing precursor to deposit at least one hafnium containing monolayer on the deposition surface, e.g., the sidewalls and base of the trench 10, as depicted in FIG. 3. In one example, the flow rate for the hafnium containing precursor may range from 0.3 sccm to 300 sccm. The deposition temperature may range from 200° C. to 300° C. The pressure within the deposition chamber may range from 0.1 Torr to 0.2 Torr. In one embodiment, the pulse time for the hafnium containing precursor ranges from 30 seconds to 150 seconds. In another embodiment, the pulse time for the hafnium containing precursor may range from 70 seconds to 110 seconds. In one example, the hafnium containing precursor may be (EtMeN)$_4$Hf (TEMAH) that is introduced at a flow rate of 0.4 sccm, the pulse time may be 90 seconds, the pressure may be on the order of 0.15 torr, and the deposition temperature may be 250° C. Following deposition of the at least one monolayer of hafnium, the hafnium containing precursor may be purged from the deposition chamber of the atomic layer deposition apparatus at step 200. The purge gas may be an inert gas, such as argon (Ar). The sequence of the applying the hafnium containing precursor at step 100 and the purging the hafnium containing precursor at step 200 may be referred to as a first sequence of the deposition process flow that is depicted in FIG. 4.

In a following step 300, a first pulse of oxygen containing precursor is applied to the deposition surface, e.g., trench, of the semiconductor substrate being housed by the deposition chamber of the atomic layer deposition apparatus. In one embodiment, the oxygen precursor deposits at least one oxygen containing monolayer on the previously deposited hafnium containing monolayer. The deposition temperature, pressure, and precursor pulse time for the application of the oxygen containing precursor may be similar to the values used for the hafnium containing precursor. In one example, the oxygen containing precursor is ozone (O$_3$). Following deposition of the at least one monolayer of oxygen, the oxygen containing precursor may be purged from the deposition chamber of the atomic layer deposition apparatus at step 400. The purge gas may be an inert gas, such as argon (Ar). The sequence of the oxygen containing precursor application at step 300, and the oxygen containing precursor purge at step 400, may be referred to as a second sequence of the deposition process flow that is depicted in FIG. 4.

The first and second sequences for depositing the monolayers of hafnium and oxygen may be repeated until a desired layer thickness has been reached at step 500. In some embodiments, the desired total thickness of the deposited hafnium and oxygen monolayers prior to application of the tris dimethyl amido silane gas precursor may range from 0.5 nm to 2 nm. In another embodiment, the desired total thickness of the deposited hafnium and oxygen monolayers prior to application of the tris dimethyl amido silane gas precursor may range from 0.75 nm to 1.75 nm. In some embodiments, the first and second sequences may be repeated from 10 to 15 times until the desired thickness is achieved. The act of repeating the first and second sequences of the deposition process flow depicted in FIG. 4 may be referred to as the third sequence.

In some embodiments, once the desired thickness of the hafnium and oxygen containing monolayers has been deposited, silicon may be introduced to the deposited monolayers by applying a pulse of tris dimethyl amido silane precursor at step 600. In some embodiments, the process conditions for the pulse of tris dimethyl amido silane precursor are selected so that following thermal processing of the deposited monolayers, the silicon that is provided by the tris dimethyl amido silane precursor is present at the grain boundaries of the tetragonal phase hafnium oxide in an amount ranging from 3 wt. % to 20 wt. %. In one embodiment, the flow rate of the tris dimethyl amido silane precursor ranges from 25 sccm to 300 sccm. In another embodiment, the flow rate of the tris dimethyl amido silane precursor ranges from 75 sccm to 250 sccm. In one embodiment, the pulse time for the tris dimethyl amido silane precursor ranges from 30 seconds to 150 seconds. In another embodiment, the pulse time for the tris dimethyl amido silane precursor ranges from 70 seconds to 110 seconds. The deposition temperature may range from 200° C. to 300° C. The pressure within the deposition chamber may range from 0.1 torr to 0.2 torr. In one example, the tris dimethyl amido silane precursor may introduced at a flow rate of 50 sccm for a pulse time of 90 seconds, wherein the pressure may be on the order of 0.15 torr, and the deposition temperature may be 250° C.

Referring to step 700, once the silicon has been introduced to the deposited monolayers of hafnium and oxygen, the tris dimethyl amido silane precursor can be purged from the deposition chamber of the atomic layer deposition apparatus. The purge gas may be an inert gas, such as argon (Ar). The sequence of the applying the tris dimethyl amido silane precursor at step 600 and the purging the tris dimethyl amido silane precursor at step 700 may be referred to as a fourth sequence of the deposition process that is depicted in FIG. 4.

Following purging of the tris dimethyl amido silane precursor, a second pulse of oxygen containing precursor may be applied to the deposition surface, e.g., trench, of the semiconductor substrate at step 800. The second pulse of oxygen containing precursor that is applied at step 800 is similar to the first pulse of oxygen containing precursor that is described above with reference to step 300 of the deposition process flow that is depicted in FIG. 4. Therefore, the above description of the first pulse of oxygen containing precursor from step 200 of the deposition process flow is suitable for describing the second pulse of the oxygen containing precursor in step 800. The second pulse of oxygen containing precursor may apply at least one monolayer of oxygen to the deposited hafnium and oxygen layers that include silicon from the tris dimethyl amido silane precursor. At step 900, a purge of the oxygen containing precursor may be conducted using an inert gas, such as argon. The sequence of the applying the second pulse of oxygen containing precursor at step 800, and the purging of the second pulse of oxygen containing precursor at step 900, may be referred to as a fifth sequence of the deposition process flow that is depicted in FIG. 4.

Referring to step 1000 of FIG. 4, following purging of the second pulse of the oxygen containing precursor, the thickness of the deposited materials provided by the deposition process flow described with reference to steps 100-900 is measured to determine if the final thickness for the dielectric layer, such as the dielectric layer 12 depicted in FIG. 3, has been reached. In one embodiment, the final thickness of the dielectric layer 12 may range from 1 nm to 20 nm. In another embodiment, the dielectric layer 12 has a thickness ranging from 3 nm to 10 nm. In one embodiment, to provide that the dielectric layer has sufficient thickness, the first sequence, second sequence, third sequence, fourth sequence, and the fifth sequence of deposition process flow that is depicted in FIG. 4 may be repeated two to ten times at step 1000. Once the final thickness of the dielectric layer 12 has been reached, the dielectric layer 12 may be subjected to post atomic layer deposition processing at step 1100.

Figure 5:
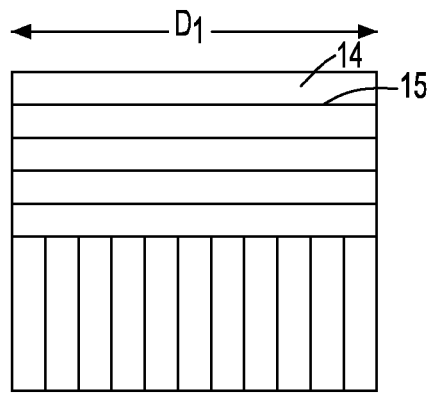
FIG. 5 is a pictorial view of tetragonal phase hafnium oxide, wherein silicon is present at grain boundaries in the tetragonal phase hafnium oxide in an amount ranging from 3 wt. % to 20 wt. %, in accordance with one embodiment of the present disclosure.

The monolayers of hafnium and oxygen that include the silicon introduced by the tris dimethyl amido silane precursor when subject to thermal processing provide a tetragonal phase hafnium oxide having silicon, e.g., silicon dioxide, present at the grain boundaries, as depicted in FIG. 5. One example of thermal processing that is suitable for forming the tetragonal phase hafnium oxide layer that is provided by the methods disclosed herein includes annealing at a temperature greater than 500° C. Thermal annealing to stabilize the tetragonal phase hafnium oxide that provides the dielectric layer 12 of the trench structure depicted in FIG. 3 may occur at any stage of processing following the deposition of the material layers that provide the tetragonal phase hafnium oxide. In some embodiments, the thermal annealing to stabilize the hafnium oxide occurs as part of the process flow for forming the components of a memory device, such as an eDRAM memory device. Examples of processes that may serve to stabilize the tetragonal hafnium oxide during the formation of a memory device include activation annealing for the source and drain regions of the access transistor of the memory device, thermal annealing for the formation of metal semiconductor contacts, e.g., silicides, to the memory device, and thermal processing during the formation of shallow trench isolation (STI) regions.

In some embodiments, the thermal annealing forces the silicon to the grain boundaries 15 of the tetragonal phase hafnium oxide, wherein the silicon forms silicon oxide. The grain boundary is the interface between two grains, wherein the grains are provided by hafnium oxide having the tetragonal phase. The presence of the silicon, e.g., silicon oxide, at the grain boundaries reduces leakage when compared to hafnium oxide that does not include silicon, e.g., silicon oxide, at the grain boundaries. In some embodiments, the large band gap of silicon oxide acts as a barrier to electrons leaving the grains of the tetragonal phase hafnium oxide. By retaining electrons within the grains of the tetragonal phase hafnium oxide, the methods and structures disclosed herein enable a substantially reduced leakage in comparison to material layers of hafnium oxide that do not include an interface composed of silicon, e.g., silicon oxide. The presence of the silicon, e.g., silicon oxide, at the grain boundaries acts as a catalyst to reduce the mean free energy of the hafnium oxide to provide the high dielectric constant tetragonal phase. In one embodiment, the tetragonal phase hafnium oxide with silicon, e.g., silicon oxide, present at the grain boundaries in an amount ranging from 3 wt. % to 20 wt. % may have a dielectric constant ranging from 30 to 50. In another embodiment, the tetragonal phase hafnium oxide with silicon, e.g., silicon oxide, present at the grain boundaries in an amount ranging from 3 wt. % to 20 wt. % may have a dielectric constant ranging from 30 to 40. In an even further embodiment, the tetragonal phase hafnium oxide with silicon, e.g., silicon oxide, present at the grain boundaries in an amount ranging from 3 wt. % to 20 wt. % may have a dielectric constant ranging from 30 to 35.

Further, high temperature annealing dictates a large grain size for the tetragonal phase hafnium oxide. As used herein, the terms "large grain" and "large grain size" denote tetragonal phase hafnium oxide grains having lateral dimension of 700 Å or greater for a vertical dimension of 100 Å. Referring to FIG. 5, in one embodiment, the grains 14 of tetragonal hafnium oxide, i.e., tetragonal phase hafnium oxide, may have a greatest axis with a dimension D1 ranging from 300 Å to 1000 Å. In another embodiment, the grains 14 of tetragonal hafnium oxide, i.e., tetragonal phase hafnium oxide, may have a greatest axis with a dimension D1 ranging from 500 Å to 700 Å. The combination of large grains of high-k dielectric constant tetragonal hafnium oxide in combination with grain boundaries composed of silicon oxide provides for a dielectric material that when incorporated into electrical devices, such as memory devices, allows for a higher reliability and a lower leakage. In some embodiments, the silicon is only present at the grain boundaries, and is not present in the grains of tetragonal hafnium oxide.

Figure 6:
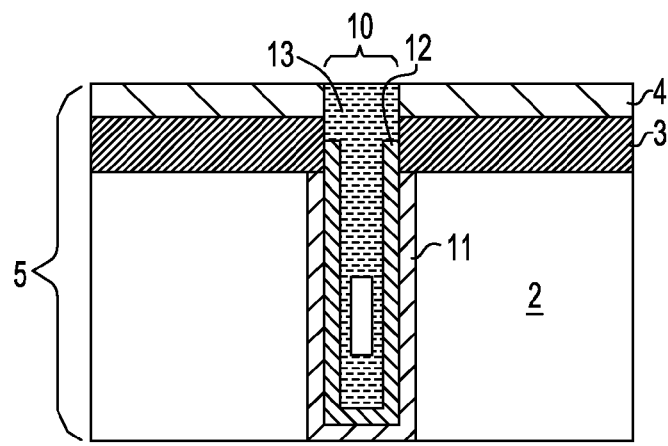
FIG. 6 is a side cross-sectional view depicting forming a second electrode on the dielectric layer, wherein the first electrode, the dielectric layer and the second electrode provide a capacitor that is present in the trench, in accordance with one embodiment of the present disclosure.

FIG. 6 depicts one embodiment of forming a second electrode 13 on the dielectric layer 12 that is present within the trench 10. In some embodiments, the upper surface of the dielectric layer 12 that is composed of the tetragonal phase hafnium oxide may be recessed within the trench 10 before the formation of the second electrode 13. The upper surfaces of the dielectric layer 12 may be recessed by an anisotropic etch process, such as a reactive ion etch. In some embodiments, the second electrode (also referred to as upper electrode) 13 may be provided by a doped semiconductor material. One example of a doped semiconductor material that is suitable for the second electrode 13 is n-type doped polysilicon. In some embodiments, the second electrode 13 may be composed of a metal. In one embodiment, the metal that provides the second electrode 13 may be selected from the group consisting of titanium nitride (TiN), tantalum nitride (TaN), tantalum silicon nitride (TaSiN), tungsten nitride (WN) or a combination thereof. The material for the second electrode 13 may be deposited using physical vapor deposition (PVD), such as plating or sputtering, or may be deposited using chemical vapor deposition (CVD). In some embodiments, the second electrode 13 fills the entirety of the trench 10, or the deposited material layer that provides the second electrode 13 pinches the opening of the trench 10 closed forming a void in a lower portion of the trench 10. Following deposition, the material that provides the second electrode 13 may be planarized so that the upper surface of the second electrode 13 may be coplanar with the upper surface of the SOI layer 4 of the semiconductor substrate 5.

Figure 7:
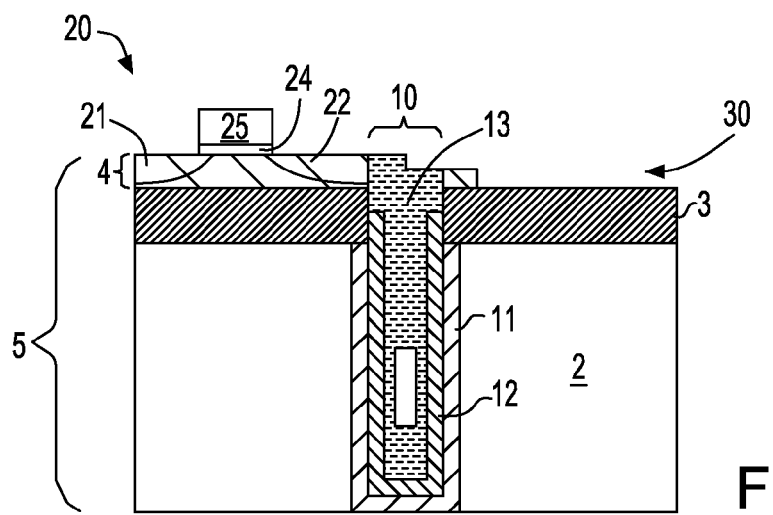
FIG. 7 is a side cross-sectional view depicting forming an access transistor in electrical communication with the capacitor that is present in the trench, in accordance with the present disclosure.

Referring to FIG. 7, the first electrode 11, the dielectric layer 12, and the second electrode 13 provide a capacitor (also referred to as a trench capacitor) that is present in the trench 10. The capacitor may be employed in a memory device, such as an embedded dynamic random access memory (eDRAM) device. As used herein, the term "memory device" means a structure in which the electrical state thereof can be altered and then retained in the altered state, in this way a bit of information can be stored. The memory device may also include an access transistor 20 that is in electrical communication with the capacitor. By "electrical communication" it is meant that current may pass from the access transistor 20 to the capacitor. The access transistor 20 may be formed on the SOI layer 4 of the semiconductor substrate 5 in electrical communication with the capacitor. In one embodiment, the access transistor 20 is a field effect transistor (FET), such as n-type and/or p-type FET. The field effect transistor (FET) may include a source region 21, a drain region 22, and a gate structure 23. Typically, at least one of the source region and drain regions 21, 22 of the access transistor 20 is in electrical communication with the second electrode 13 of the capacitor. The gate structure 23 typically includes at least one gate dielectric 24 and at least one gate conductor 25. In one embodiment, an isolation region 30, such as a trench top oxide (TTO), is formed overlying the capacitor that is present within the trench 10.

In some embodiments, the thermal processing that is employed for at least one of the source and drain regions 21, 22, the isolation region 30 and the gate dielectric 24 of the gate structure 23 may provide the thermal processing to stabilize the dielectric layer 12 that is composed of the tetragonal phase hafnium oxide, which includes silicon oxide at the grain boundaries of the tetragonal phase hafnium oxide. One example of a thermal anneal sequence includes a first anneal stage of a furnace anneal at a temperature of 750° C. to 850° C. for a first time period ranging from 20 minutes to 30 minutes; a second anneal stage of rapid thermal anneal at a temperature of 950° C. to 1050° C. for a second time period ranging from 10 seconds to 60 seconds, followed by an anneal spike to greater than 1100° C. (for a time period ranging from 1 second to 7 seconds); and a third anneal stage of laser annealing at greater than 1200° C. for a third time period ranging from 1 millisecond to 500 milliseconds. Annealing in at least one of the first, second and third annealing stages may be done in a nitrogen ($N_2$) atmosphere. In addition to stabilizing the dielectric layer 12 of the tetragonal phase hafnium oxide, the first anneal stage anneal may be the anneal for processing an oxide isolation region, such as the trench top oxide. In addition to stabilizing the dielectric layer 12 that is composed of the tetragonal phase hafnium oxide, the second anneal stage may be the anneal for processing the gate dielectric layer 24 of the gate structure 25. In addition to stabilizing the dielectric layer 12 that is composed of the tetragonal phase hafnium oxide, the second anneal stage may be the activation anneal for the source region 21 and the drain region 22.

The following examples are provided to further illustrate the methods and structures of the present disclosure and to demonstrate some advantages that arise therefrom. It is not intended that the disclosure be limited to only the specific examples disclosed.

EXAMPLE 1

Capacitance Measurement

Test capacitors were formed using a dielectric layer composed of tetragonal phase hafnium oxide having silicon oxide present at the grain boundaries in the amount ranging from 3 wt. % to 20 wt. %. The dielectric layer composed of the tetragonal phase hafnium oxide was formed with ten cycles of hafnium containing gas precursor followed by one cycle of tris dimethyl amido silane precursor, in which the sequence of hafnium containing gas precursor deposition and tris dimethyl amido silane gas precursor deposition was repeated 5 times followed by being capped with 8 cycles of hafnium containing gas precursor deposition. The dielectric layer was deposited using the atomic layer deposition sequence described above with reference to FIG. 4. An electrode composed of titanium nitride (TiN) having a resistivity ranging from 75 μm·cm to 120 μm·cm may be formed on one face of the dielectric layer. Another electrode is formed on the opposite side of the dielectric layer that is composed of n-type doped epitaxial silicon having a doping concentration of $1 \times 10^{20}$ atoms/cm$^3$ to $1 \times 10^{21}$ atoms/cm$^3$.

Control capacitors were formed using a dielectric layer composed of hafnium oxide (HfO$_2$) layer that did not include silicon oxide at the grain boundaries. The hafnium oxide layer of the control capacitor was formed using atomic layer deposition. The electrodes to the control capacitors were identical to the electrodes to the test capacitors. The physical dimensions of the control capacitors were identical to the physical dimensions of the test capacitors.

Figure 8:
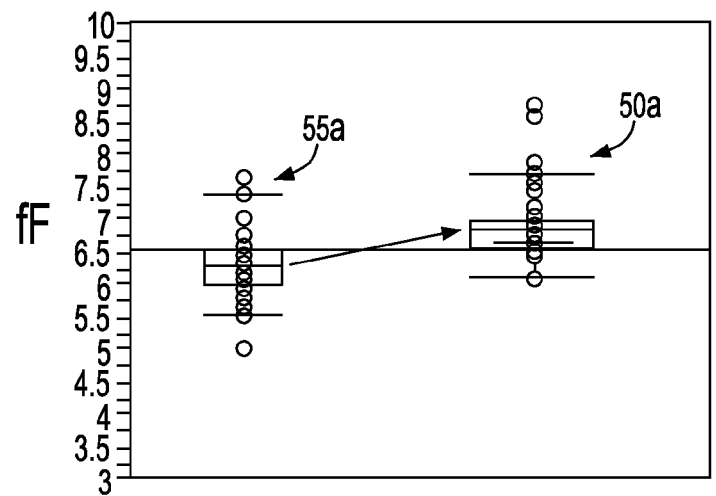
FIG. 8 is a plot of capacitance measured from a capacitor including a dielectric layer composed of tetragonal phase hafnium oxide, wherein silicon is present at the grain boundaries of the tetragonal phase hafnium oxide in an amount ranging from 3 wt. % to 20 wt. %, in comparison to a similarly physically structured capacitor including a hafnium oxide layer without silicon being present at the grain boundaries at a voltage of approximately 1 volt, in accordance with one embodiment of the present disclosure.

Capacitance was then measured from the test capacitors and the control capacitors when applied to voltages of 1V, 0V at frequency ranges of 1 KHz to 1 MHz. FIG. 8 is a plot of capacitance measured from a test capacitor (cluster of data points identified by reference number 50a) including a dielectric layer composed of tetragonal phase hafnium oxide, wherein silicon oxide is present at the grain boundaries of the tetragonal phase hafnium oxide in an amount ranging from 3 wt. % to 20 wt. % in comparison to a control capacitor (cluster of data points identified by reference number 55a) including a hafnium oxide layer without silicon oxide being present at the grain boundaries at a voltage of approximately 1 volt. As illustrated by the plots depicted in FIG. 8, the test capacitors including the dielectric layer composed of the tetragonal phase hafnium oxide with silicon oxide grain boundaries had a higher capacitance than the control capacitors. Capacitance for the test capacitors at 1 volt was 15% to 20% higher than the control capacitors at substantially the same leakage.

Figure 9:
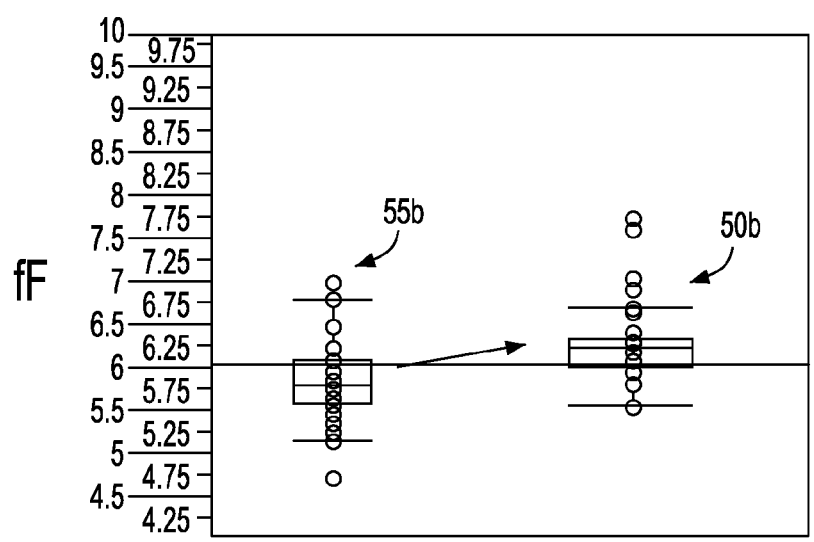
FIG. 9 is a plot of capacitance measured from a capacitor including a dielectric layer composed of tetragonal phase hafnium oxide wherein silicon is present at the grain boundaries of the tetragonal phase hafnium oxide in an amount ranging from 3 wt. % to 20 wt. %, in comparison to a similarly physically structured capacitor including a hafnium oxide layer without silicon being present at the grain boundaries at a voltage of approximately 0 volt, in accordance with one embodiment of the present disclosure.

FIG. 9 is a plot of capacitance measured from a test capacitor (cluster of data points identified by reference number 50b) including a dielectric layer composed of tetragonal phase hafnium oxide, wherein silicon oxide is present at the grain boundaries of the tetragonal phase hafnium oxide in an amount ranging from 3 wt. % to 20 wt. %, in comparison to a control capacitor (cluster of data points identified by reference number 55b) including a hafnium oxide layer without silicon oxide being present at the grain boundaries at a voltage of approximately 0 volt. As illustrated by the plots depicted in FIG. 9, the test capacitors including the dielectric layer composed of the tetragonal phase hafnium oxide with silicon oxide grain boundaries had a higher capacitance than the control capacitors. Capacitance for the test capacitors at 0 volt was approximately 7% to 8% greater than the control capacitors at substantially the same leakage.

Figure 10:
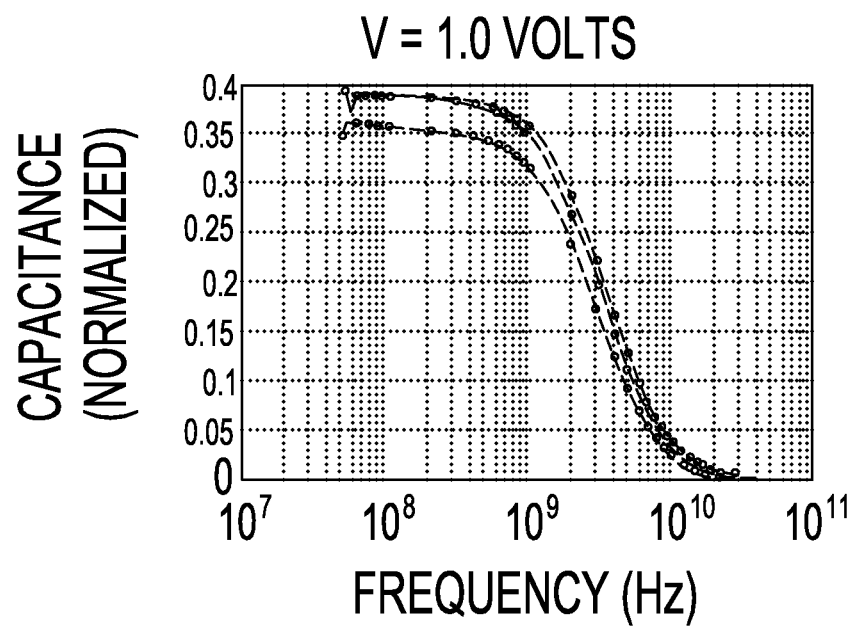
FIG. 10 is a plot depicting operation of the test capacitor including a dielectric layer composed of tetragonal phase hafnium oxide, wherein silicon oxide is present at the grain boundaries of the tetragonal phase hafnium oxide in an amount ranging from 3 wt. % to 20 wt. % at a frequency of approximately 1 GHz based on S-parameter measurements, in accordance with one embodiment of the present disclosure.

FIG. 10 is a plot depicting operation of the test capacitor including a dielectric layer composed of tetragonal phase hafnium oxide, wherein silicon oxide is present at the grain boundaries of the tetragonal phase hafnium oxide in an amount ranging from 3 wt. % to 20 wt. % at a frequency of approximately 1 GHz based on S-parameter measurements.

The test capacitor that provided the plots in FIGS. 8-10 had a measured capacitance ranging from 10 fF to 12 fF.

EXAMPLE 2

Leakage

Figure 11:
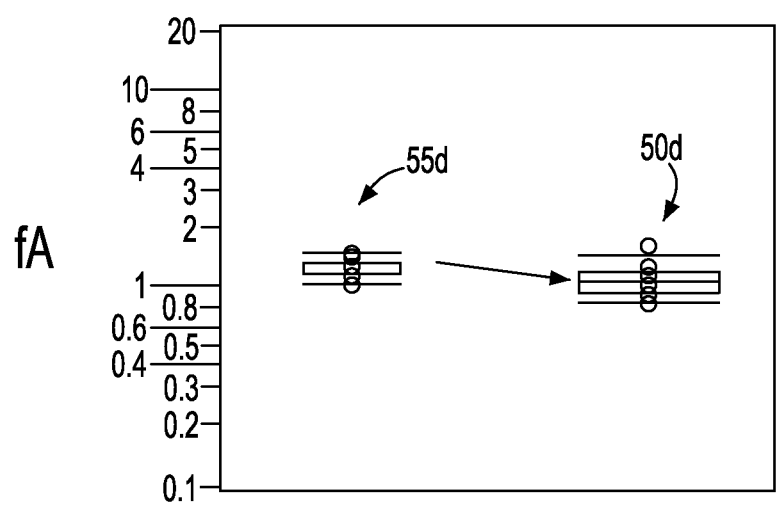
FIG. 11 is a plot of leakage measured from a capacitor including a dielectric layer composed of tetragonal phase hafnium oxide wherein silicon is present at the grain boundaries of the tetragonal phase hafnium oxide in an amount ranging from 3 wt. % to 20 wt. %, in comparison to a similarly physically structured capacitor including a hafnium oxide layer without silicon being present at the grain boundaries at a voltage of approximately 1 volt, in accordance with one embodiment of the present disclosure.

The test capacitors and control capacitors described in Example 1 were tested for leakage. FIG. 11 is a plot of leakage measured from a test capacitor (cluster of data points identified by reference number 50d) including a dielectric layer composed of tetragonal phase hafnium oxide wherein silicon oxide is present at the grain boundaries of the tetragonal phase hafnium oxide in an amount ranging from 3 wt. % to 20 wt. %, in comparison to a control capacitor including a hafnium oxide layer without silicon oxide being present at the grain boundaries at a voltage of approximately 1 volt. As illustrated by the data plotted in FIG. 11, leakage for the control capacitors at 1 volt was higher than the test capacitors. The test capacitor that provided the plot in FIG. 11 had a measured leakage ranging from 0.1 fA to 2 fA.

EXAMPLE 2

Breakdown Voltage

Figure 12:
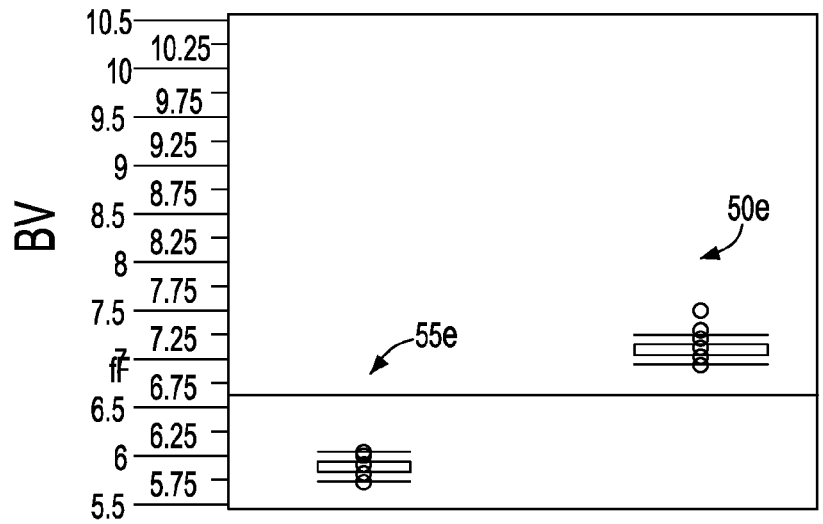
FIG. 12 is a plot of breakdown voltage measured from a capacitor including a dielectric layer composed of tetragonal phase hafnium oxide wherein silicon is present at the grain boundaries of the tetragonal phase hafnium oxide in an amount ranging from 3 wt. % to 20 wt. %, in comparison to a similarly physically structured hafnium oxide layer without silicon being present at the grain boundaries, in accordance with one embodiment of the present disclosure.

The test capacitors and control capacitors described in Example 1 were tested for breakdown voltage. FIG. 12 is a plot of breakdown voltage measured from a test capacitor (cluster of data points identified by reference number 50e) including a dielectric layer composed of tetragonal phase hafnium oxide wherein silicon oxide is present at the grain boundaries of the tetragonal phase hafnium oxide in an amount ranging from 3 wt. % to 20 wt. %, in comparison to a control capacitor (cluster of data points identified by reference number 55e) including a hafnium oxide layer without silicon oxide being present at the grain boundaries. As illustrated by the data plotted in FIG. 12, the breakdown voltage for the control capacitors was less than the breakdown voltage of the test capacitors. The test capacitor that provided the plot in FIG. 12 had a measured breakdown voltage ranging from 6.5V to 7.5V.

EXAMPLE 3

Reliability

Figure 13:
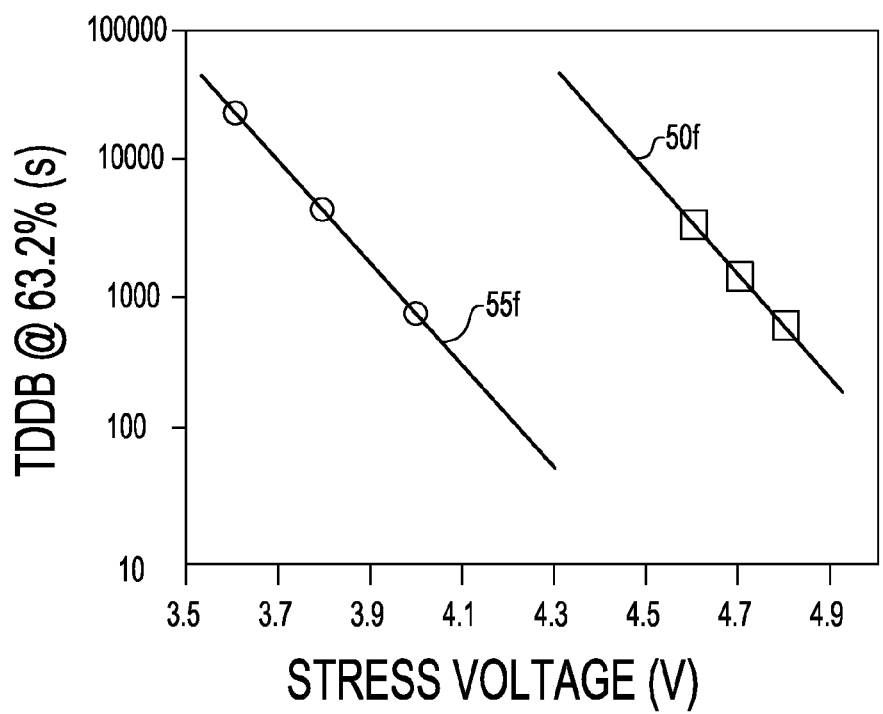
FIG. 13 is a plot of TDDB@ 63.2% (s) (Time for Dielectric Breakdown) as a function of stress voltage for a capacitor including a dielectric layer composed of tetragonal phase hafnium oxide wherein silicon is present at the grain boundaries of the tetragonal phase hafnium oxide in an amount ranging from 3 wt. % to 20 wt. %, in comparison to a similarly physically structured hafnium oxide layer without silicon being present at the grain boundaries, in accordance with one embodiment of the present disclosure.

The test capacitors and control capacitors described in Example 1 were tested for reliability. FIG. 13 is a plot of TDDB@ 63.2% (s) (Time for Dielectric Breakdown) as a function of stress voltage measured from a test capacitor (plot line identified by reference number 50f) including a dielectric layer composed of tetragonal phase hafnium oxide wherein silicon is present at the grain boundaries of the tetragonal phase hafnium oxide in an amount ranging from 3 wt. % to 20 wt. %, in comparison to a similarly physically structured hafnium oxide layer (plot line identified by reference number 55f) without silicon being present at the grain boundaries. Reliability results indicate that in some embodiments $<10^{-9}$ parts per million devices will fail after 10 years of operation at 125 C at a use voltage of 1.1V.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A trench structure comprising:
    a trench having a width ranging from 30 nm to 250 nm, and an aspect ratio greater than 20:1; and
    a dielectric layer that is continuously present on the sidewalls and base of the trench, wherein the dielectric layer has a dielectric constant that is greater than 30, wherein the dielectric layer is comprised of tetragonal phase hafnium oxide with silicon present at grain boundaries of the tetragonal phase hafnium oxide in an amount ranging from 3 wt. % to 20 wt. %.

2. The trench structure of claim 1, wherein a first electrode and a second electrode are present on opposing sides of the dielectric layer.

3. The trench structure of claim 2, wherein the dielectric layer comprised of the tetragonal phase hafnium oxide having the silicon present at the grain boundaries in the amount ranging from 3 wt % to 20 wt % has an increased capacitance of 10% or greater in comparison to a hafnium oxide ($HfO_2$) layer that does not include silicon in grain boundaries of the hafnium oxide, wherein the hafnium oxide layer has a similar physical structure as the dielectric layer comprised of the tetragonal phase hafnium oxide.

4. The trench structure of claim 2, wherein the dielectric layer comprised of the tetragonal phase hafnium oxide having the silicon present at the grain boundaries in the amount ranging from 3 wt % to 20 wt % has a capacitance ranging from 10 fF to 12 fF.

5. The trench structure of claim 2, wherein the dielectric layer comprised of the tetragonal phase hafnium oxide having the silicon present at the grain boundaries in the amount ranging from 3 wt % to 20 wt % has a leakage ranging from 0.1 fA to 2.0 fA.

6. The trench structure of claim 2, wherein the dielectric layer comprised of the tetragonal phase hafnium oxide having the silicon present at the grain boundaries in the amount ranging from 3 wt % to 20 wt % has an increased breakdown voltage in comparison to a hafnium oxide ($HfO_2$) layer that does not include silicon at the grain boundaries of the hafnium oxide having a similar structure as the dielectric layer comprised of the tetragonal phase hafnium oxide.

7. The trench structure of claim 2, wherein the dielectric layer comprised of the tetragonal phase hafnium oxide having the silicon present at the grain boundaries in the amount ranging from 3 wt % to 20 wt % has a breakdown voltage ranging from 6.5 V to 7.5 V.

8. A memory device comprising:
    a trench present in a semiconductor substrate;
    a capacitor that is present in the trench, wherein the capacitor includes a first electrode that is present about at least one of the sidewalls and base of the trench, a dielectric layer present on the first electrode, and a second electrode that is present on the dielectric layer, wherein the dielectric layer is comprised of tetragonal phase hafnium oxide having silicon present in an amount ranging from 3 wt. % to 20 wt. % at grain boundaries in the tetragonal phase hafnium oxide; and
    an access transistor that is in electrical communication with the capacitor.

9. The memory device of claim 8, wherein the dielectric constant of the dielectric layer is greater than 30.

10. The memory device of claim 9, wherein a remainder of the dielectric layer is comprised of hafnium and oxygen.

11. The memory device of claim 10, wherein the silicon that is present at the grain boundaries of the tetragonal phase hafnium oxide reduces the mean free energy of the tetragonal phase hafnium oxide to stabilize the tetragonal phase to temperatures as great as 1500° C.

12. The memory device of claim 8, wherein the dielectric layer is a conformal layer.

13. The memory device of claim 8, wherein the first electrode that is present about the sidewalls is provided by a concentration of n-type, p-type or a combination of n-type and p-type dopant in the sidewalls and the base of the trench, or the first electrode is provided by a deposited metal layer.

14. The memory device of claim 8, wherein the second electrode is comprised of a metal or doped polysilicon.

* * * * *